United States Patent [19]

Stacey et al.

[11] Patent Number: 4,991,429
[45] Date of Patent: Feb. 12, 1991

[54] TORQUE ANGLE AND PEAK CURRENT DETECTOR FOR SYNCHRONOUS MOTORS

[75] Inventors: Eric J. Stacey, Penn Hills Twp, Allegheny County, Pa.; Geoffrey M. Smith, Reisterstown, Md.

[73] Assignee: Westinghouse Electric Corp., Pittsburgh, Pa.

[21] Appl. No.: 458,216

[22] Filed: Dec. 28, 1989

[51] Int. Cl.$^5$ ............................................. G01R 31/34
[52] U.S. Cl. .................................. 73/116; 318/490; 324/158 MG
[58] Field of Search ............... 73/116; 324/158 MG; 318/490; 322/99

[56] References Cited

U.S. PATENT DOCUMENTS

| | | | |
|---|---|---|---|
| 4,099,103 | 7/1978 | Seeger et al. | 318/490 X |
| 4,229,694 | 10/1980 | Wilson et al. | 324/158 MG |
| 4,348,892 | 9/1982 | Emanuel | 73/116 |
| 4,669,024 | 5/1987 | Stacey . | |

OTHER PUBLICATIONS

Analog Devices, Data-Acquisition Databook 1984, vol. I, Integrated Circuits, pp. 13-29.

Primary Examiner—Charles A. Ruehl

[57] ABSTRACT

A torque angle and peak current detector for a three-phase synchronous motor utilizes a phase-locked loop to generate a digital stator field position signal phase locked to the stator current. The phases of digital-sine and cosine reference signals generated from the field position signal are compared with x and y stator current component signals in multiplying digital to analog converters to generate a phase error signal which is driven to zero with the reference signals in quadrature with the current component signals at phase lock. The reference signals are also multiplied by in-phase current component signals and the products are summed to generate the peak current signal. A digital rotor angle position generated by a resolver and an analog to digital converter is subtracted from the digital field position signal to generate the torque angle signal.

14 Claims, 3 Drawing Sheets

TORQUE ANGLE AND PEAK CURRENT DETECTOR FOR SYNCHRONOUS MOTORS

BACKGROUND OF THE INVENTION

1. Field of Invention

This invention relates to a detector which generates an electrical signal representative of the instantaneous angle of the torque generated by a synchronous motor, and which, in addition, generates a signal representative of the magnitude of motor current which can be used together with the torque angle to determine the torque.

2. Background of the Invention

In many synchronous machine control applications it is useful to know the torque angle on a dynamic basis. It is known to measure torque with an electromechanical torque transducer. However, such devices utilize a strain gauge which produces a low level signal. In addition, the electromechanical torque transducer is not very accurate and due to mechanical torque transients has a narrow bandwidth response.

There is a need therefore for an improved sensor for dynamically measuring torque in a synchronous motor.

There is a further need for such a sensor with a wide bandwidth.

There is also a need for such a system which provides a dynamic reading of the torque angle.

There is an additional need for such a sensor which provides a dynamic wide bandwidth signal representing the magnitude of the multiphase current applied to the stator of the synchronous motor.

SUMMARY OF THE INVENTION

These and other needs are satisfied by the torque angle sensor of the invention. The novel sensor produces a real time torque angle signal and a wide bandwidth stator current magnitude signal which provide accurate dynamic torque measurements despite distorted motor currents. In particular, the torque angle sensor of the invention includes means monitoring the rotation of the rotor and generating a rotor position signal. Signals representative of the multiphase stator current are used to generate a field position signal representing the instantaneous angular position of the composite magnetic field produced by the stator currents. A torque angle signal is generated by means which determine the difference between the rotor position signal and the field position signal.

In accordance with an important aspect of the invention, the means producing the field position signal is a phase-locked loop. This phase locked loop includes phase comparators in the form of multipliers which multiply the current signals by reference component signals generated from the field position signal. The phase error signals generated by the phase multipliers are summed, with the total error applied to phase shifting means. The phase shifting means generates a variable frequency signal having a frequency which is a function of the magnitude of the total error signal. A signal generator generates the field position signal from the variable frequency signal. Preferably, the signal generator is a digital counter which produces a digital signal representing the field position signal. The reference component signals are generated from the field position signal. The phase shifting means adjusts the frequency of the variable frequency signal to shift the phase of the field position signal. This in turn results in a shift in phase of the reference component signals in a direction which drives the total error signal toward zero. When the field position signal is phase-locked to the current signals, the reference component signals are in quadrature with the current signals. Additional means multiply the current signal by in phase reference components of the field position signal to generate the wide bandwidth current magnitude signal.

In the preferred form of the invention, a two-phase, x and y component, representation of the three-phase stator current is used in the phase-locked loop to reduce the component count and provide wide bandwidth response. The two reference component signals generated from the field position signal are a sine wave signal and a cosine wave signal which are multiplied by the x component current signal and the y component current signal, respectively. In addition, the x component current signal is multiplied by the in phase sine waveform signal and the y component current signal is multiplied by the in phase cosine component signal, and the product signals are summed to generate the current magnitude signal. Because the phase-locked loop rapidly tracks changes in current, the detector of the invention provides accurate rapid response to changes in stator current.

BRIEF DESCRIPTION OF THE DRAWINGS

A full understanding of the invention can be gained from the following description of the preferred embodiment when read in conjunction with the accompanying drawings in which.

DESCRIPTION OF THE PREFERRED EMBODIMENT

Figure 1:
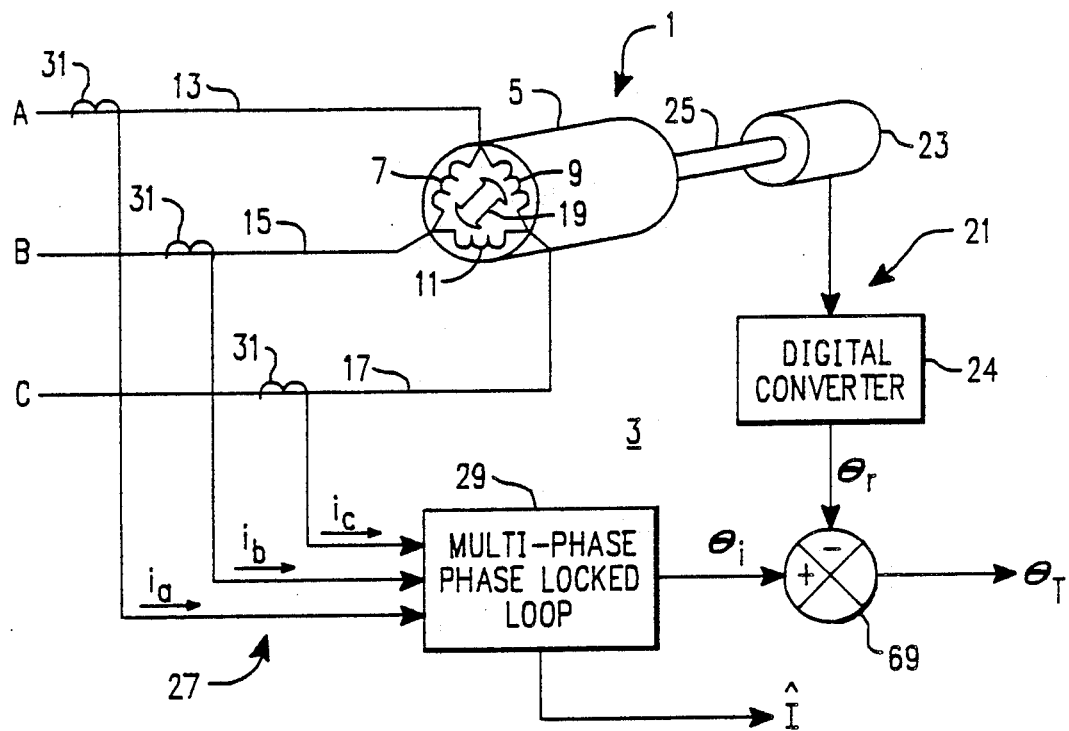
FIG. 1 is schematic diagram of the torque detector of the invention connected to a three-phase synchronous motor.

FIG. 1 illustrates schematically a three-phase synchronous motor 1 to which the torque sensor 3 of the invention is applied. The synchronous motor 1 includes a stator 5 having three phase windings 7, 9, and 11 which are fed by three phases A, B, and C of an ac current supplied on leads 13, 15 and 17, respectively. The motor 1 also includes a rotor 19.

Torque angle ($\theta_T$) in the synchronous motor 1 is defined as the angular position of the composite field ($\theta_i$) set-up in the stator by the currents in the stator windings 7, 9, and 11, relative to the position of the rotor ($\theta_r$), as expressed in the following equation:

$$\theta_T = \theta_i - \theta_r$$

Since torque is a sinusoidal function of torque angle, if the torque angle of the synchronous motor 1 is controlled to 90 degrees, maximum torque is applied to the rotor. Maximum torque is proportional to the magnitude of the stator current. Obviously, the torque can change rapidly with transients in the current.

In accordance with the invention, torque angle is determined by measuring stator current and rotor position and performing the above calculation. The torque sensor of the invention achieves fast response and high accuracy by employing digital and analog circuits to measure both the torque angle and magnitude of the stator current at any motor speed from locked rotor to full speed in either direction.

The angle of the rotor $\theta_r$ is generated by a torque angle generator 21 which includes a resolver 23 connected to the rotor shaft 25 of the machine 1. Resolvers which provide a high degree of resolution of angular shaft position are well known. The output of such resolvers is a pair of ac signals in quadrature whose relative magnitudes represent rotor position. The torque angle generator 21 includes a resolver to digital converter 24 which converts these ac signals into the digital rotor angle signal $\theta_r$.

The field position angle $\theta_i$ and current magnitude generator 27 of the torque detector 3 comprises a multiphase phase locked loop 29 and current transducers 31 which generate current signals $i_a$, $i_b$ and $i_c$ which represent the multiphase stator current. The current transducers 31 are able to operate accurately at dc and low frequency as well as full frequency levels of the multiphase stator current. For a three-wire machine 1, two or three transducers may be used. Using two transducers and summing and difference circuits to generate three-current representations is well known and reduces the component count.

Figure 2A:
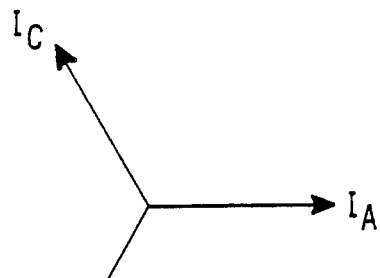
FIG. 2A is a vector diagram of the three-phase stator current of the synchronous motor and FIG. 2B is a two component representation of that three-phase current.
Figure 2B:
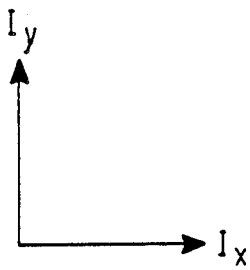

A further simplification of circuitry can be achieved by operating the multiphase, phase-locked loop 29 with a two-phase representation of the three-phase currents. The vector relationship between the three-phase representation shown in FIG. 2A and the two component representation shown in FIG. 2B is expressed mathematically as:

$$i_x = i_a$$
$$i_y = \frac{1}{\sqrt{3}} (i_c - i_b)$$

Figure 3:
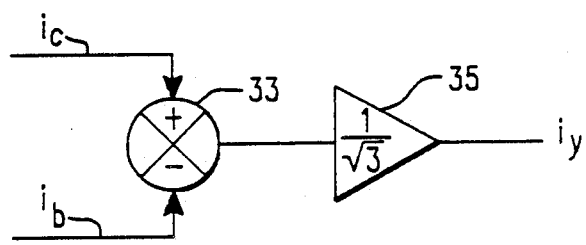
FIG. 3 is a schematic diagram of a circuit which is part of the torque detector of the invention and which generates one component of a two-phase representation of the three-phase stator current of the synchronous motor shown in FIG. 1.

A circuit suitable for generating the component $i_y$ is shown in FIG. 3 wherein the current $i_b$ is subtracted from the current $i_c$ in the difference circuit 33 with the resultant signal applied to an amplifier 35 having a gain equal to one over the square root of three to produce the $i_y$ signal.

Figure 4:
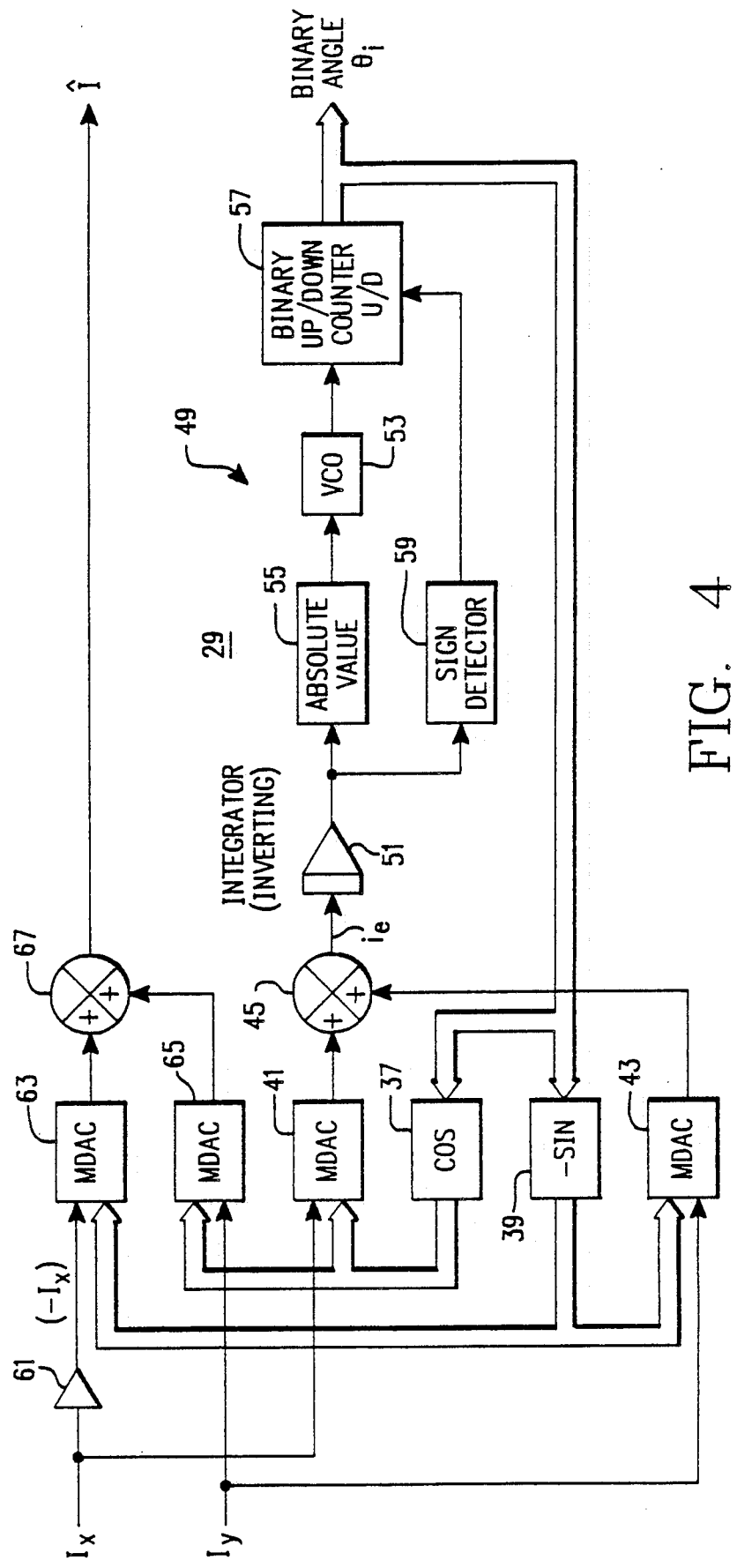
FIG. 4 is a schematic diagram in block form of the field position generator and peak current generator which form part of torque angle detector of FIG. 1.

FIG. 4 illustrates the phase-locked loop circuit 29. This phase lock loop circuit 29 generates the signal $\theta_i$ representative of the angular position of the composite field generated by the stator current, phase-locked to the x and y current components, $i_x$ and $i_y$. The phase-locked loop circuit 29 generates a digital cosine reference signal from the digital field position $\theta_i$ in synthesizer 37 and a digital -sine signal in synthesizer 39. The phase of the cosine reference signal is compared with the phase of the $i_x$ component signal in a phase comparator 41. Similarly, the phase of the -sine reference signal is compared with the phase of the $i_y$ component signal in phase comparator 43. The phase comparators 41 and 43 are preferably multiplying digital to analog converters which multiply the digital reference signals by the appropriate analog current component signals to produce analog phase error signals which are summed in the summing circuit 45 to produce a total error signal, $i_e$. This total phase error signal $i_e$ is applied to a phase shifting circuit 49 which includes an inverting integrator 51 which generates an integrated phase error signal. The integrated phase error signal is applied to a voltage controlled oscillator (VCO) 53 which as known generates a variable frequency signal having a frequency which is determined by the magnitude by the integrated error signal. Since the integrated error signal may be either positive or negative depending upon the direction of rotation of the motor, and since the VCO 53 can only respond to voltages of one polarity, an absolute value circuit 55 converts the integrated error signal into a magnitude signal which is applied to the VCO.

The variable frequency signal generated by the VCO 53 is applied to a binary up-down counter 57 which counts zero crossings of the variable frequency signals to generate the binary field position signal $\theta_i$. The direction in which the binary counter 57 counts is controlled by a sign detector circuit 59 which monitors the polarity of the integrated error signal generated by the integrator 51. Thus, the counter 57 counts in the up direction for one direction of rotation of the rotor, and counts down for a rotation in the opposite direction.

The digital field position signal $\theta_i$ is used to address read only memories (ROMs) which comprise the synthesizers 37 and 39. These ROMs have stored in sequential addresses the values of the cosine and -sine reference signals, respectively. The frequency of the variable frequency signal generated by the VCO 53 controls the binary counter 57 to produce a field position signal $\theta_i$ which shifts the phase of the cosine and -sine references signals in a direction to drive the total error signal $i_e$ toward zero which is the phase locked condition. When the field position signal, $\theta_i$, is phase-locked to the $i_x$ and $i_y$ components of the stator current, the cosine and -sine reference signals are in quadrature with the $i_x$ and $i_y$ current components, respectively. As is known, when two ac signals in quadrature are multiplied by each other, a signal with a dc value of zero results although this signal has an ac component of twice the fundmental frequency. However, when two additional signals which are in quadrature, and are also in quadrature with the first two signals are multiplied by each other and the result is added to the result of the multiplication of the first two signals, a dc signal of zero value with no ripple is produced. Thus, the phase-lock loop 29 of the invention provides wide bandwidth response for the field position signal, $\theta_i$.

The stator current magnitude signal I is generated by multiplying the reference signals generated by the phase-lock loop circuit 29 by their in phase current components and summing the results. Thus, as shown in FIG. 4, the $i_x$ current component signal is inverted by inverter 61 and multiplied by the -sine reference signal by the multiplying digital to analog converter 63. The inverter 61 is required to bring the $i_x$ signal into phase with the -sine reference signal. Similarly, the $i_y$ current component signal is multiplied by the in-phase cosine reference signal in multiplying digital to analog converter 65. The outputs of the multiplying digital to analog converters 63 and 65 are added in summer 67 to produce the peak current signal I.

In FIG. 4, the heavy lines indicate buses carrying multibit digital signals. In the exemplary embodiment of the invention 8-bit digital signals were used to generate the binary angle signal $\theta_i$ and the cosine and -sine reference signals.

Returning to FIG. 1, it can be seen that the digital torque angles signal $\theta_T$ is generated by subtracting the digital rotor position signal, $\theta_r$, generated by the digital converter 24 from the digital field position signal $\theta_i$ generated by the phase-lock loop 29 in arithmetic logic unit 69.

Figure 5:
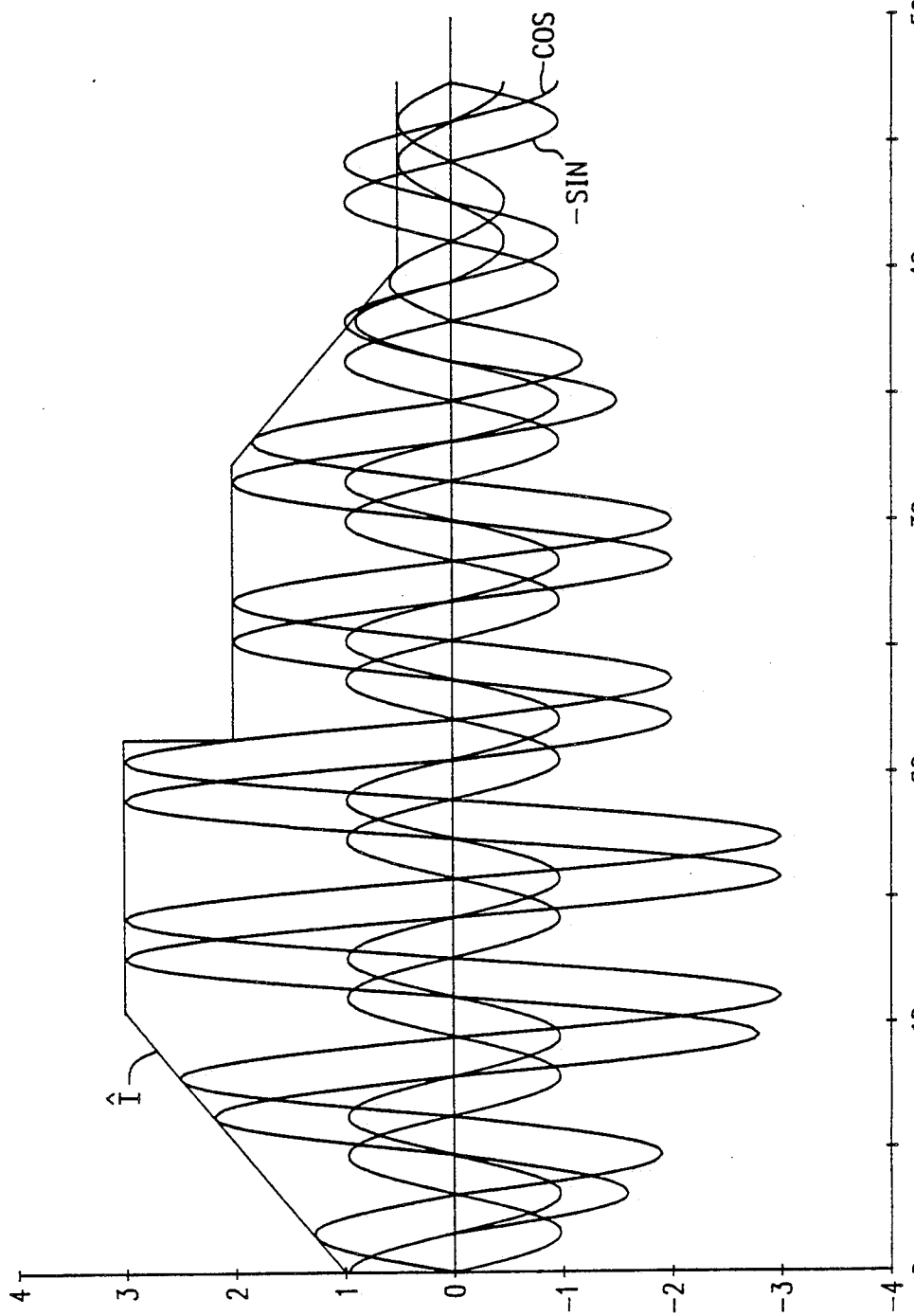
FIG. 5 is a plot of the signals used by the peak current generator shown in FIG. 4 to generate the peak current signal.

FIG. 5 illustrates the generation of the peak current signal I. It can be seen in this plot that the cosine reference signal is in phase with the $i_y$ current component signal with which it is multiplied. It can also be seen that the -sine reference signal is a 180 degrees out of phase with the $i_x$ current component. Hence, the inverter 61 is employed to shift the $i_x$ signal into phase with the -sine reference signal. It can be appreciated from this plot that the peak amplitude signal I rapidly tracks variations in the magnitude of the current component signals $I_x$ and $I_y$.

The high performance torque angle and current detector described herein can be used in synchronous motor drives when precise, fast control of torque angle is required or when measurement of torque angle is needed to evaluate the dynamic performance of other control strategies. This novel detector, dynamically and precisely, measures torque angle and current magnitude over the entire speed range, forward and reverse, and at locked rotor.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and an and all equivalents thereof.

What is claimed is:

1. A torque angle detector for a multiphase synchronous motor having a rotor and a stator winding to which multiphase current is applied to operate said motor, said detector comprising:
   means monitoring rotation of said rotor and generating a rotor position signal representing an instantaneous angular position of the rotor;
   means monitoring the multiphase current applied to said stator winding and generating current signals representative of said multiphase current;
   means generating from said current signals a field position signal representing the instantaneous angular position of a composite magnetic field produced by said current in the motor; and
   means determining the difference between the field position signal and said rotor position signal to produce a torque angle signal.

2. The torque angle detector of claim 1 wherein said means generating said field position signal includes means generating from said current signals and said field position signal, a continuous signal representative of the peak magnitude of said multiphase current.

3. The torque angle detector of claim 1 wherein said means generating said field position signal comprises a phase locked loop circuit generating said field position signal phase locked to said current signals.

4. The torque angle detector of claim 3 wherein said phase locked loop circuit includes phase comparator means comparing said current signals with component reference signals to produce a phase error signal, phase shifting means generating a variable frequency signal having a frequency determined by said phase error signal, signal generating means generating said field position signal from said variable frequency signal, and reference signal generating means generating said component reference signals from said field position signal, said phase shifting means shifting the frequency of said variable frequency signal to reduce the phase error signal by shifting the phase of the field position signal which in turn shifts the phase of the component reference signals to bring the phases of said component reference signals into quadrature relationship with said current signals when the phase error signal is substantially zero.

5. The torque angle detector of claim 4 including multiplier means multiplying each current signal by an in phase component reference signal to generate component magnitude signals and means summing the component magnitude signals to generate a current magnitude signal representative of the magnitude of peak current generated by the synchronous motor.

6. The torque angle detector of claim 4 wherein said signal generating motor is a digital counter which generates a digital field position signal.

7. The torque angle detector of claim 6 wherein said signal generating motor is a bidirectional digital counter, wherein said phase comparison means generates an analog phase error signal and wherein said phase shifting means includes an integrator integrating said phase error signal to generate an analog integrated error signal, a voltage controlled oscillator generating said variable frequency signal with a frequency proportional to the magnitude of said integrated error signal, and a sign detector responsive to the sign of the integrated error signal, said bidirectional counter counting at the frequency of said variable frequency signal and in a direction determined by said sign detector to produce a field position signal for rotation of said rotor in either direction.

8. The torque angle detector of claim 1 wherein said synchronous motor is a three-phase motor having a stator winding to which a three-phase current is applied; wherein said means monitoring the multiphase current generates a two phase representation of the three-phase current comprising x and y current components signals which are in quadrature, and wherein said means generating said field position signal generates the field position signal from said x and y current component signals.

9. The torque angle detector of claim 8 wherein said means generating the field position signal comprises a phase locked loop generating said field position signal phase locked to said x and y current component signals.

10. The torque angle detector of claim 9 wherein said phase locked loop includes first and second phase multipliers multiplying said x and y current component signals by first and second component reference signals to generate component phase error signals, means summing said component phase error signals to generate a total phase error signal, phase shifting means generating a variable frequency signal having a frequency determined by said total phase error signal, signal generator means generating said field position signal from said variable frequency signal, and reference signal generating means generating said component reference signals from said field position signal, said phase shifting means shifting the frequency of said variable frequency signal to reduce the total phase error signal by shifting the phase of the field position signal which in turn shifts the phase of the component reference signals to bring the phases of the component reference signals into quadrature relationship with said x and y current component signals when said total phase error signal is substantially zero.

11. The torque angle detector of claim 10 wherein said reference signal generating means includes sine wave generating means generating a sine wave signal from said field position signal and cosine wave generating means generating a cosine wave signal from said field position signal, wherein said first phase multiplier multiplies said x current component signal by said cosine wave signal, and said second phase multiplier multiplies said y current component signal by said sine wave signal to generate said component error signal.

12. The torque angle detector of claim 11 including third and fourth phase multipliers multiplying the x current component signal by said sine wave signal to generate a first magnitude component signal and the y current component signal by the cosine wave signal to generate a second magnitude component signal and means summing said first and second magnitude component signals to generate a motor current magnitude signal.

13. A torque angle detector for a three-phase synchronous motor having a rotor and a stator winding to which three phase current is applied to operate said motor, said detector comprising:
   means monitoring rotation of said rotor and generating a rotor position signal representing an instantaneous angular position of the rotor;
   means monitoring the three-phase current applied to the stator winding and generating x and y component current signals representative of the three-phase current;
   phase lock loop means generating a field position signal representing the instantaneous angular position of a composite magnetic field produced by said current in the motor, said field position signal being phase locked to the x and y component current signals current; and
   means determining the difference between the field position signal and said rotor position signal to produce a torque angle signal.

14. The detector of claim 13 wherein said phase lock loop generates first and second reference signals which are in quadrature with the x and y component current signals respectively, and including means multiplying the x component signal by the second reference signal to produce a first product signal and multiplying the y component signal by the first reference signal to produce a second product signal, and means summing said product signals to generate a signal representative of the peak current.

* * * * *